(12) United States Patent
Mochizuki

(10) Patent No.: US 8,803,613 B2
(45) Date of Patent: Aug. 12, 2014

(54) POWER AMPLIFICATION APPARATUS

(75) Inventor: Ryo Mochizuki, Kokubunji (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 13/593,431

(22) Filed: Aug. 23, 2012

(65) Prior Publication Data

US 2013/0069726 A1 Mar. 21, 2013

(30) Foreign Application Priority Data

Sep. 15, 2011 (JP) ................................. 2011-202245

(51) Int. Cl.
*H03F 3/191* (2006.01)

(52) U.S. Cl.
USPC ......................................... 330/302; 330/277

(58) Field of Classification Search
USPC ..................... 330/66, 277, 302, 307
See application file for complete search history.

(56) References Cited

U.S. PATENT DOCUMENTS

| | | | |
|---|---|---|---|
| 6,177,841 B1 * | 1/2001 | Ohta et al. | 330/302 |
| 6,614,311 B2 | 9/2003 | Takenaka | |
| 7,161,434 B2 * | 1/2007 | Rhodes | 330/302 |
| 7,741,907 B2 * | 6/2010 | Takagi | 330/302 |
| 8,350,627 B2 * | 1/2013 | Hellberg | 330/302 |
| 2003/0227330 A1 | 12/2003 | Khanifar et al. | |

FOREIGN PATENT DOCUMENTS

| | | |
|---|---|---|
| JP | 11-031987 A | 2/1999 |
| JP | 2002-171138 A | 6/2002 |
| JP | 2005-341447 A | 12/2005 |

OTHER PUBLICATIONS

Background Art Information, prepared by Toshiba (concise explanation of JP 11-031987A).
First Office Action mailed by Japan Patent Office on Jul. 30, 2013 in the corresponding Japanese patent application No. 2011-202245.

* cited by examiner

*Primary Examiner* — Khanh V Nguyen
(74) *Attorney, Agent, or Firm* — Knobbe, Martens, Olson & Bear, LLP

(57) ABSTRACT

According to one embodiment, a power amplification apparatus includes an field effect transistor (FET), a first decoupling element, a power supply circuit, a second decoupling element, and a third decoupling element. The FET is arranged within a package having an input terminal and an output terminal, and power-amplify an input signal from the input terminal to a transmission signal. The first decoupling element decreases an inductance component of the transmission signal output from the FET. The power supply circuit supplies a driving power to the FET. The second decoupling element cut an RF component. The third decoupling element decreases an impedance of a drain bias circuit over a wide band.

16 Claims, 13 Drawing Sheets

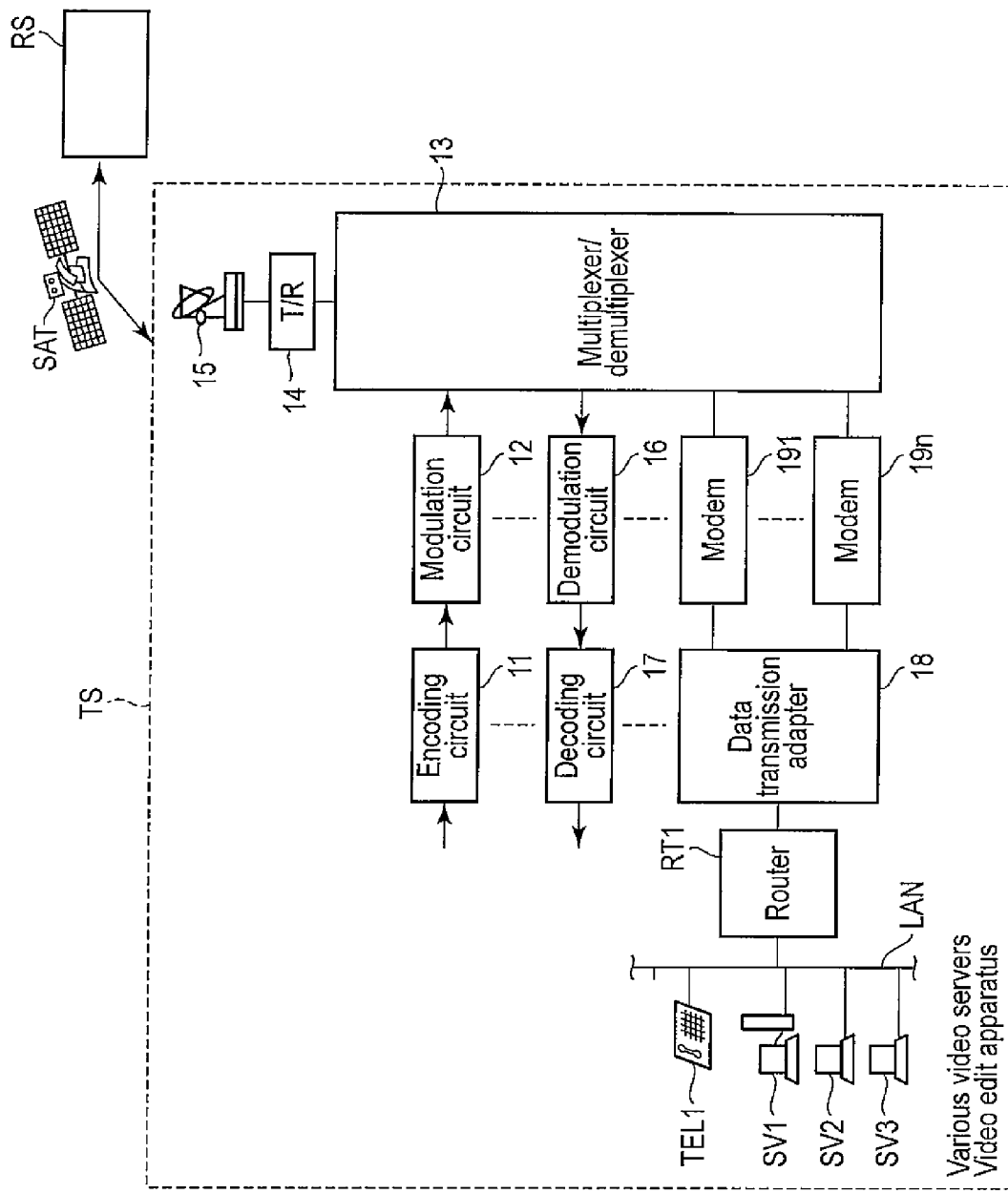
F I G. 1

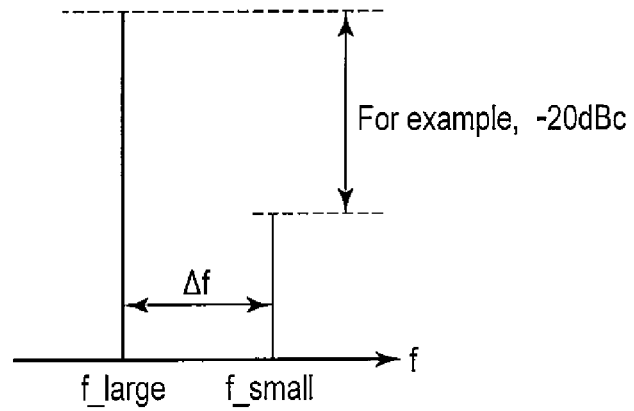
Input signal correlation
F I G. 2A
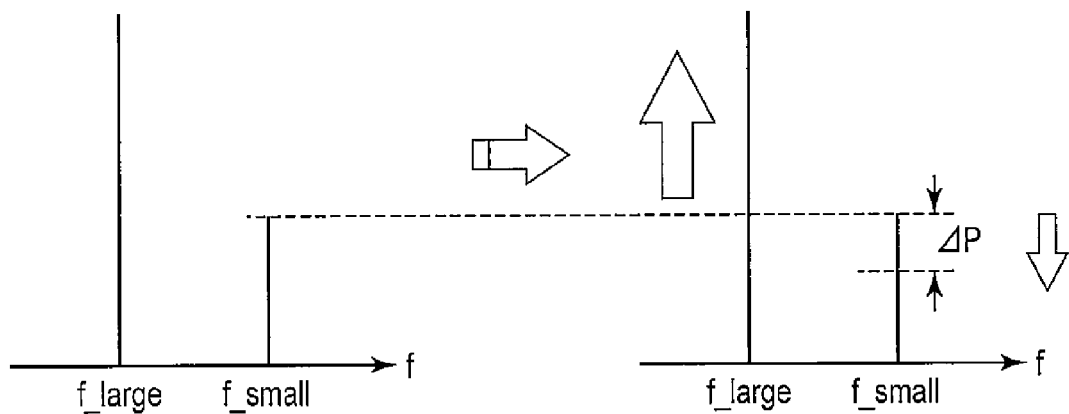
Output signal and small signal suppression ΔP
F I G. 2B

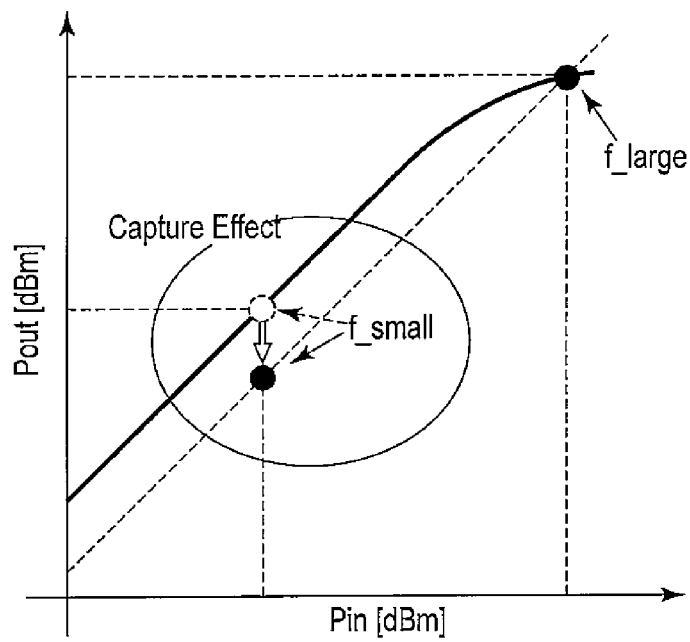
Small signal suppression due to AM AM characteristics
F I G. 3A
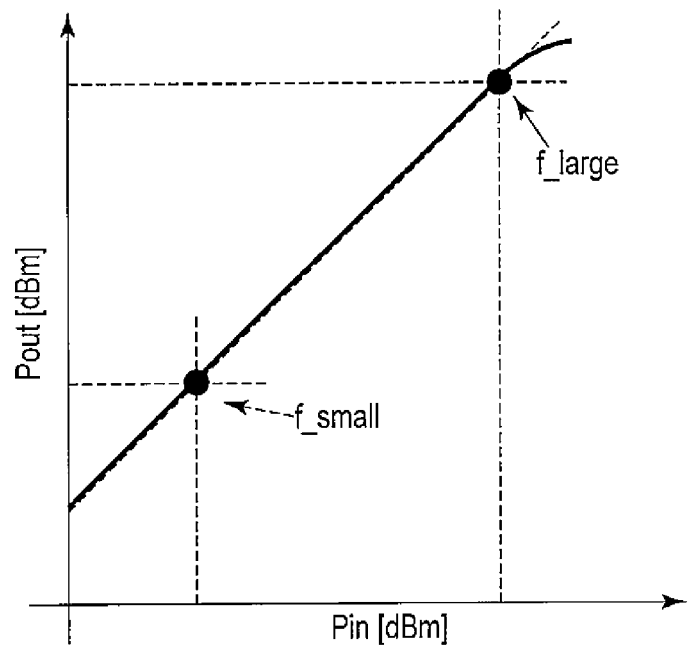
Case in which AM AM characteristics are good and small signal suppression ΔP does not occur
F I G. 3B

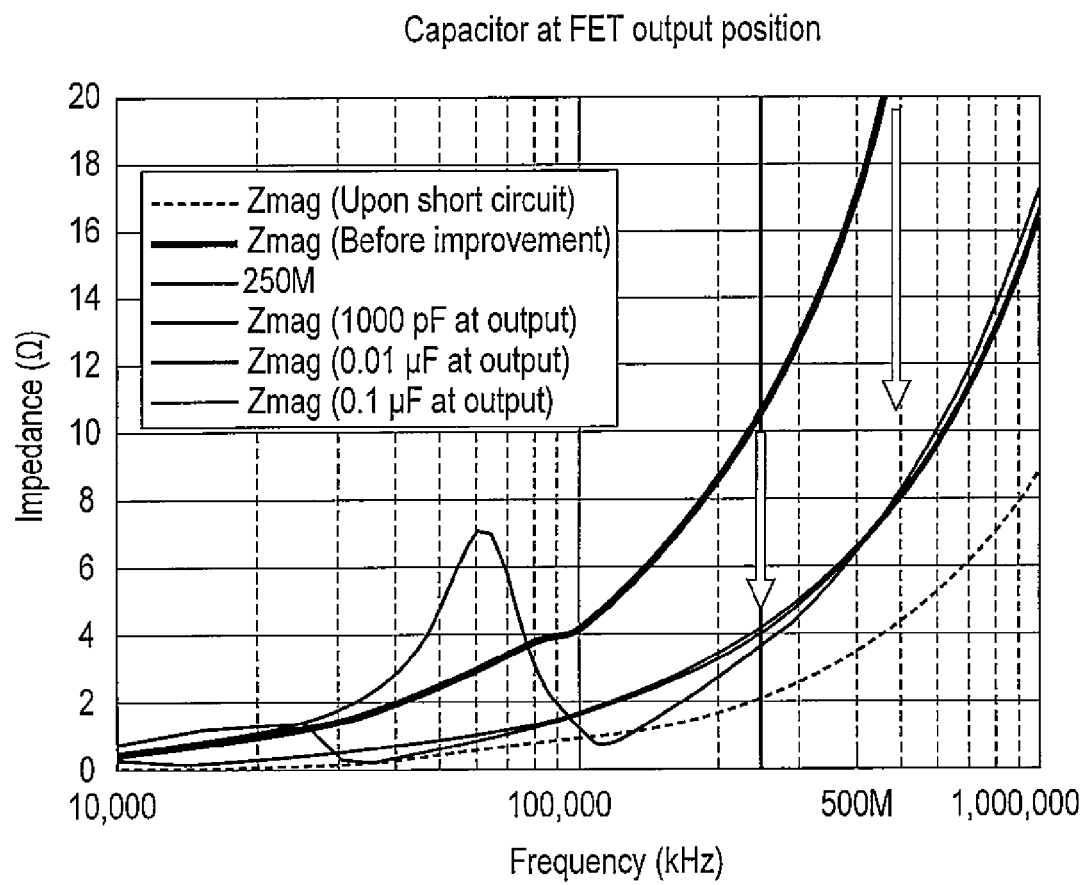
F I G. 10

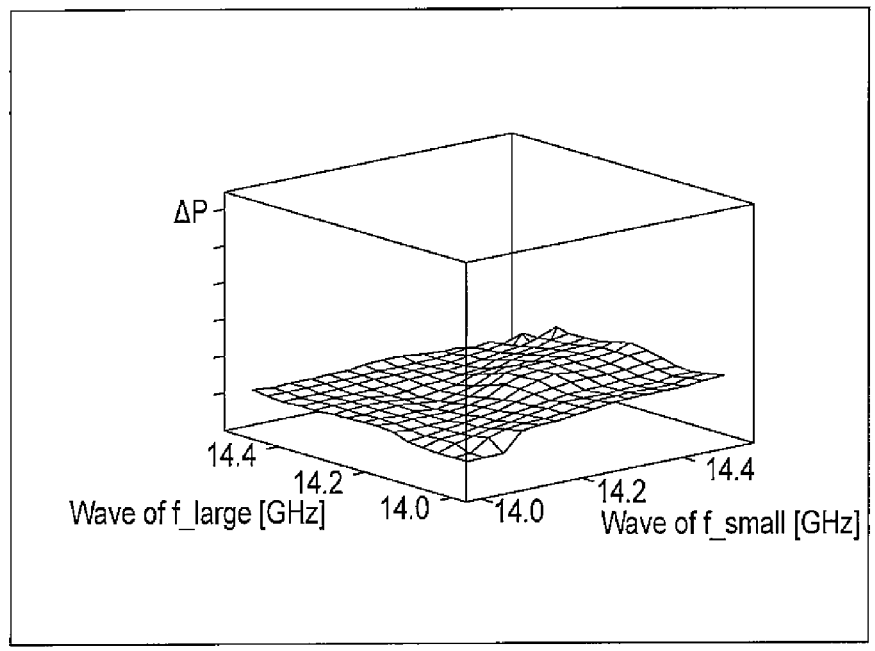
F I G. 12
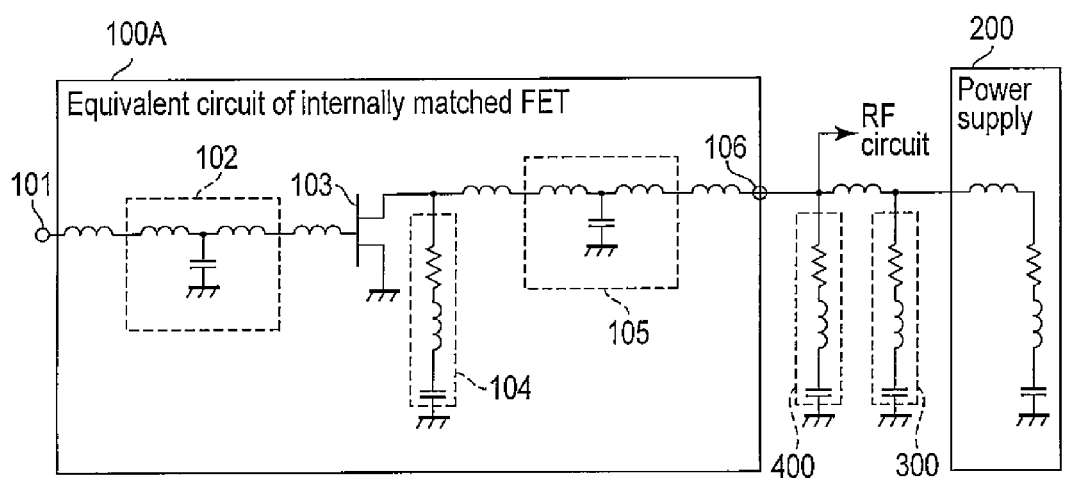
F I G. 13

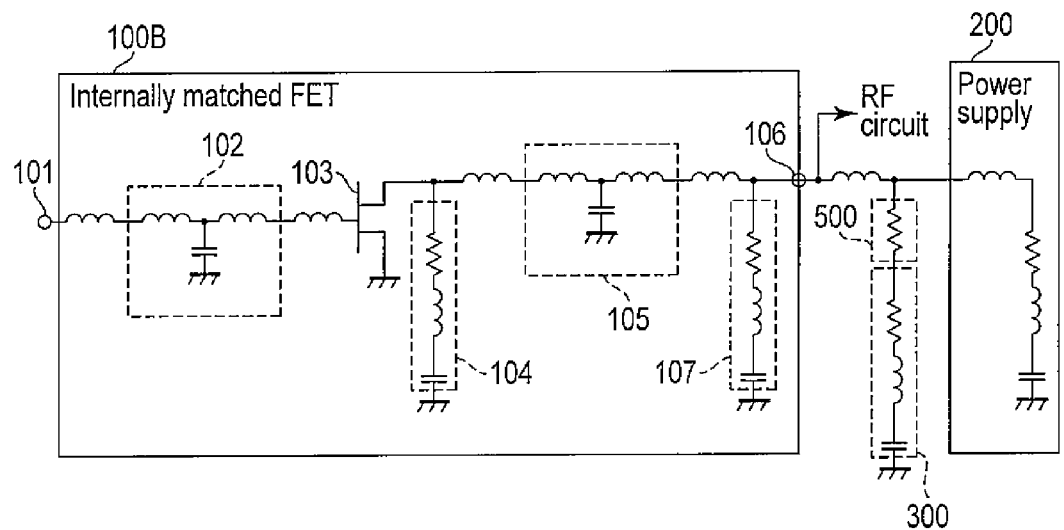
F I G. 16
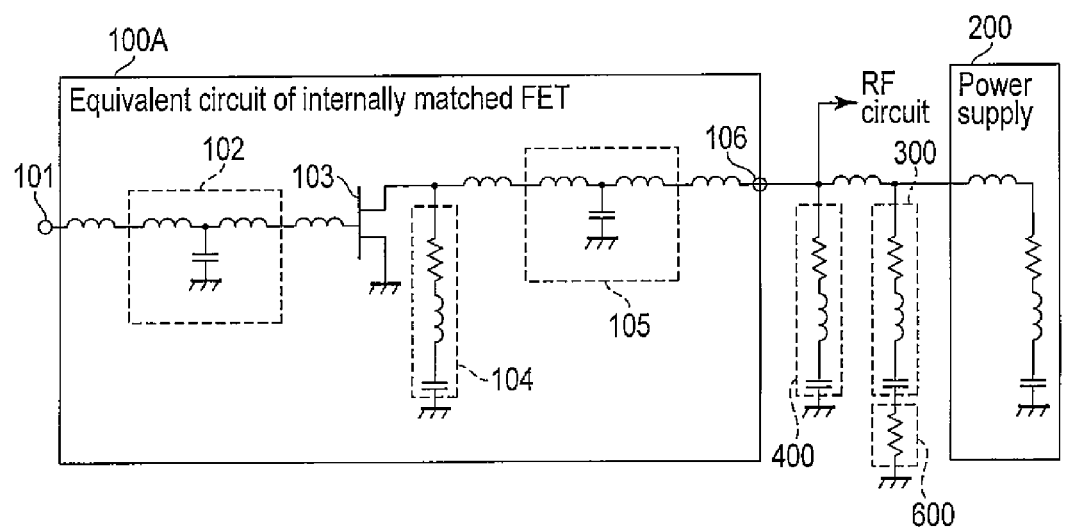
F I G. 17

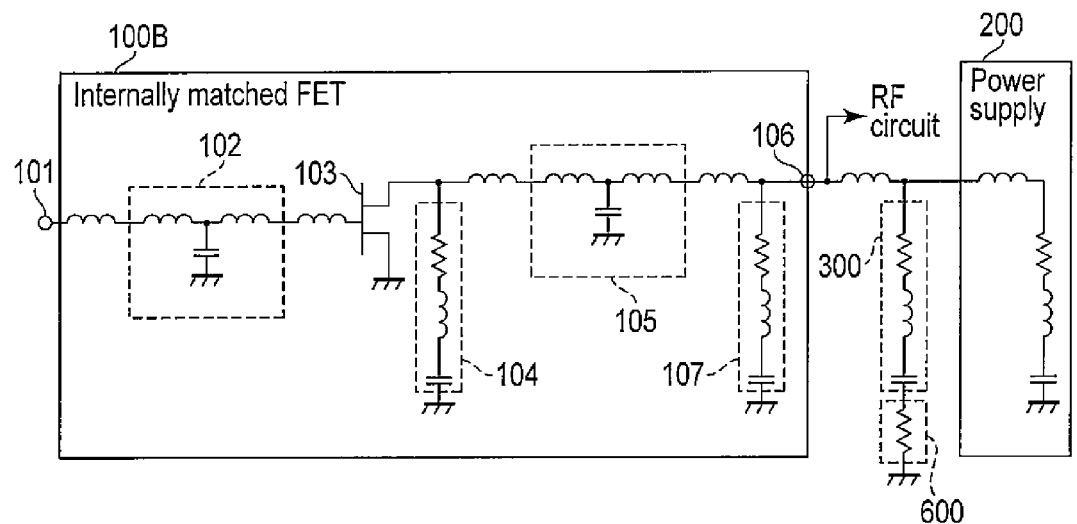
F I G. 18
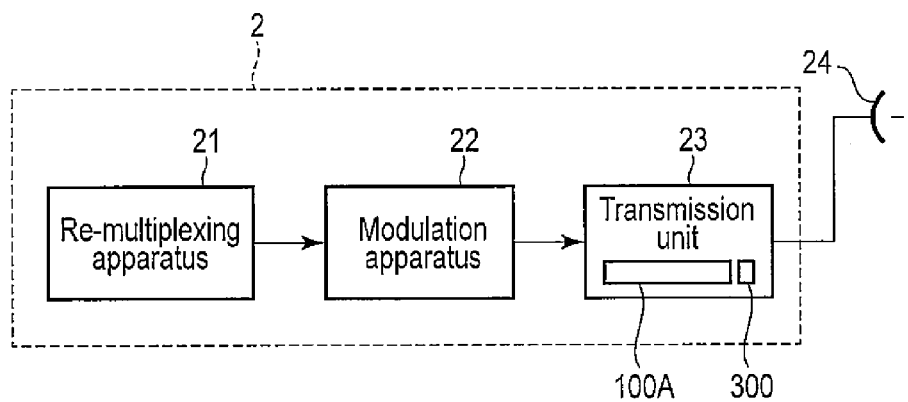
F I G. 19

POWER AMPLIFICATION APPARATUS

CROSS-REFERENCE TO RELATED APPLICATIONS

This application is based upon and claims the benefit of priority from Japanese Patent Application No. 2011-202245, filed Sep. 15, 2011, the entire contents of which are incorporated herein by reference.

FIELD

Embodiments described herein relate generally to a power amplification apparatus like a solid state power amplifier used in the microwave band communication field such as a communication satellite earth station.

BACKGROUND

In the satellite earth station, a power amplifier for amplifying a transmission power is used. In recent years, however, in place of a traveling wave tube amplifier (TWTA) which uses a traveling wave tube as one type of vacuum tube for the power amplification unit of the power amplifier, a solid state power amplifier (SSPA) which uses a field effect transistor (FET) is becoming popular. This is because a power amplification FET has an improved efficiency and increased power. Especially, along with the emergence of an FET using a gallium nitride (to be referred to as GaN)-based material (GaN HEMT: gallium nitride high electron mobility transistor), the transmission output of the SSPA has significantly improved.

It is well known that although the GaN HEMT is effective for power increase of the SSPA, it has a problem with the distortion characteristics. One of the distortion characteristics is small signal suppression due to the memory effect of the drain or gate bias of the FET.

In an application for satellite communication such as satellite news gathering (SNG), the GaN HEMT adopts a system which commonly amplifies a high power TV wave as video contents to be relayed, and a small signal of order wire (OW) wave as a link line of voice between an outside broadcast van and a studio of a TV station. If, therefore, small signal suppression occurs, the level of the OW wave decreases due to ON/OFF of the TV wave, and the line of the OW wave may be disconnected. Thus, it is necessary to prevent small signal suppression from occurring as much as possible.

Furthermore, a similar problem arises as wideband/multi-level modulation communication advances.

BRIEF DESCRIPTION OF THE DRAWINGS

FIG. 1 is a schematic view showing the configuration of a well-known SNG system;

FIGS. 2A and 2B are views showing a method of measuring an amount of suppression of the output signal of a CW wave f_small (small signal);

FIGS. 3A and 3B are graphs showing the principle according to which the capture effect occurs in a model which commonly amplifies two waves of large and small signals;

FIG. 10 is a graph showing the impedance of a bias circuit in the envelope frequency domain;

FIG. 12 is a plot showing a case in which small signal suppression is reduced when a signal is shunted at a drain terminal on a wafer within the package of an internally matched FET;

FIG. 13 is an equivalent circuit diagram showing a power amplification apparatus according to the first embodiment;

FIG. 16 is an equivalent circuit diagram showing a power amplification apparatus according to the fourth embodiment;

FIG. 17 is an equivalent circuit diagram showing a power amplification apparatus according to the fifth embodiment;

FIG. 18 is an equivalent circuit diagram showing a power amplification apparatus according to the sixth embodiment;

FIG. 19 is a schematic view showing the arrangement of a broadcasting station for the terrestrial digital television broadcasting according to another embodiment;

DETAILED DESCRIPTION

Figure 4:
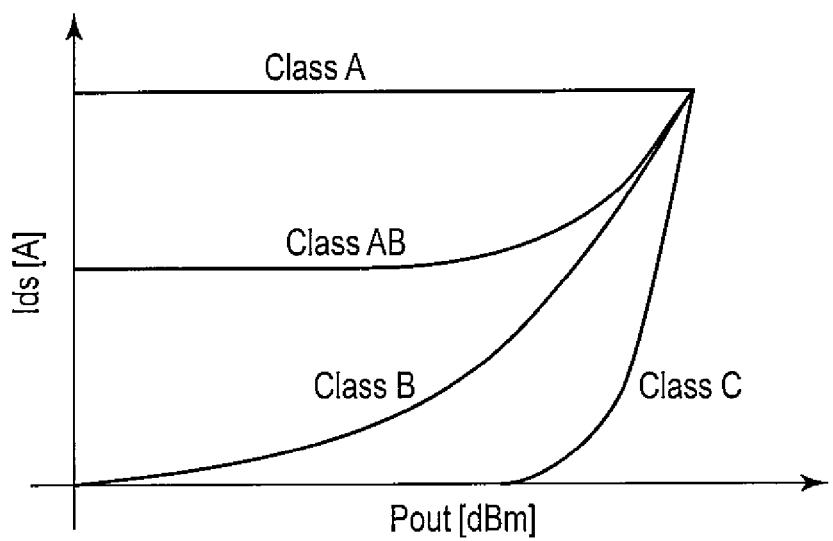
FIG. 4 is a graph showing the operational characteristics of an FET.

Hereinafter, referring the accompanying drawings, an embodiment will be explained in detail.

In general, according to one embodiment, a power amplification apparatus includes an field effect transistor (FET), a first decoupling element, a power supply circuit, a second decoupling element, and a third decoupling element. The FET is arranged within a package having an input terminal and an output terminal, and power-amplify an input signal from the input terminal to a transmission signal, for an radio frequency (RF) band, including a first signal and a second signal which include a predetermined frequency difference and level difference, and supply the transmission signal to the output terminal. The first decoupling element decreases an inductance component of the transmission signal output from the FET, and outputs the signal. The power supply circuit supplies a driving power to the FET within the package. The second decoupling element cut an RF component from the output terminal for the power supply circuit. The third decoupling element is arranged in parallel between the first decoupling element and the second decoupling element, and decreases an impedance of a drain bias circuit over a wide band while suppressing anti-resonance with the first decoupling element and the second decoupling element.

Prior to a description of the embodiment, the principle of small signal suppression measurement processing will be explained.

FIG. 1 is a schematic view showing the configuration of an SNG system as an example. Reference symbol TS denotes a satellite terrestrial station; and RS, another satellite terrestrial station.

The satellite terrestrial station TS inputs, to an encoding circuit 11, broadcast content data output from a broadcast content sending processing unit (not shown). The encoding circuit 11 encodes the input broadcast content data, and outputs the encoded data to a modulation circuit 12. The modulation circuit 12 modulates the input encoded data using a predetermined modulation scheme, and supplies the modulated signal to a transmission/reception unit (T/R) 14 via a multiplexer/demultiplexer 13.

The transmission/reception unit 14 frequency-converts the modulated signal to an RF band, amplifies the thus obtained signal to a predetermined transmission power level, and transmits the amplified high-frequency signal (large signal) from an antenna 15 to a satellite SAT through a satellite link.

Furthermore, the transmission/reception unit 14 receives the high-frequency signal which comes from the satellite SAT, and supplies the received signal to a demodulation circuit 16 via the multiplexer/demultiplexer 13. The demodulation circuit 16 digitally demodulates the received signal, and outputs the baseband encoded data to a decoding circuit 17. The decoding circuit 17 decodes the input encoded data to regenerated the original broadcast content data.

A data transmission adapter 18 for sending data of a link line, and modems 191 to 19n are arranged in the satellite terrestrial station TS. The data transmission adapter 18 is connected with a telephone TEL1 and server apparatuses SV1, SV2, and SV3 via a router RT1 and a LAN. Data originating from the telephone TEL1 and the server apparatuses SV1, SV2, and SV3 are encoded in the data transmission adapter 18 through the router RT1.

The data transmission adapter 18 outputs the encoded information to the multiplexer/demultiplexer 13 through the modems 191 to 19n, and generates, for example, a high-frequency modulation signal (small signal) using the link line.

The multiplexer/demultiplexer 13 multiplexes the large signal output from the modulation circuit 12 with the small signal. Then, the multiplexer/demultiplexer 13 causes the transmission/reception unit 14 to transmit the multiplexed signal.

As a small signal suppression measurement processing method, the following method is available.

As shown in FIG. 2A, a high-frequency input signal f_small (a small signal) is set to a power level obtained by subtracting, for example, 20 dB from the power level of a signal f_large (a large signal), thereby stopping the output signal f_large.

As shown in FIG. 2B, the amount of suppression $\Delta P$ of the output power of the output signal f_small by transmission of the output signal f_large is measured using a spectrum analyzer.

A problem of small signal suppression due to the AM-AM characteristics also occurs in a TWTA which has a problem with the AM-AM characteristics, and is well known as the "capture effect" from later half of the 1980's. The problem of small signal suppression due to the AM-AM characteristics is described in, for example, Gerard Maral, et al. "SATELLITE COMMUNICATIONS SYSTEMS", pp. 444-445.

FIGS. 3A and 3B show the principle according to which the capture effect occurs in a model which commonly amplifies two waves of large and small signals using a device with the poor input/output linearity. When the operation points of the two waves of the large and small signals fall within a linear region of the Pin-Pout characteristics, the output of the small signal never decreases due to ON/OFF of the input of the large signal (FIG. 3B).

However, if the operation point of the small signal falls within the linear region of the Pin-Pout characteristics but that of the large signal is about to fall within the non-linear region of the Pin-Pout characteristics, the output of the small signal decreases due to ON/OFF of the input of the large signal, causing a phenomenon which is called small signal suppression (FIG. 3A).

Unlike the capture effect known in the TWTA, small signal suppression $\Delta P$ occurs in a GaN HEMT due to the distortion characteristics caused by characteristics other than the AM-AM characteristics.

Figure 5:
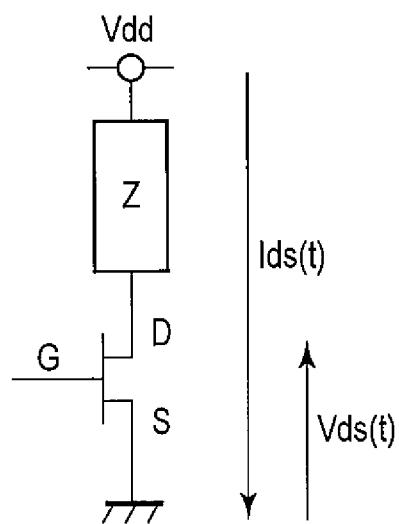
FIG. 5 is an equivalent circuit diagram showing the FET in which differential modulation of Vds occurs.

The operation of an FET changes to Class A, Class AB, Class B, and Class C in descending order of idle current (Idset), as shown in FIG. 4. For a GaN HEMT which is used in this embodiment and operates in Class AB, a drain current Ids increases/decreases with an increase/decrease in an output power Pout. At this time, if an impedance Z of a drain circuit is finite as shown in FIG. 5, Vds varies depending on Ids which varies depending on Z and Pout. Since the device parameters of a transistor depend on Vds, if modulation is performed by Vds, the memory effect occurs, thereby generating small signal suppression $\Delta P$.

The mechanism according to which small signal suppression occurs due to differential modulation of the drain bias is as follows.

The input signal of two waves indicated by frequencies $\omega 1$ and $\omega 2$ is represented x in equation (1), and an amplified output signal y is represented by equation (2).

$$x = DC + E + A_1 + A_2 + H_{11} + H_{12} + H_{22} \quad \text{equation (1)}$$

$$y = a_1 x + a_2 x^2 + a_3 x^3 \quad \text{equation (2)}$$

Figure 6:
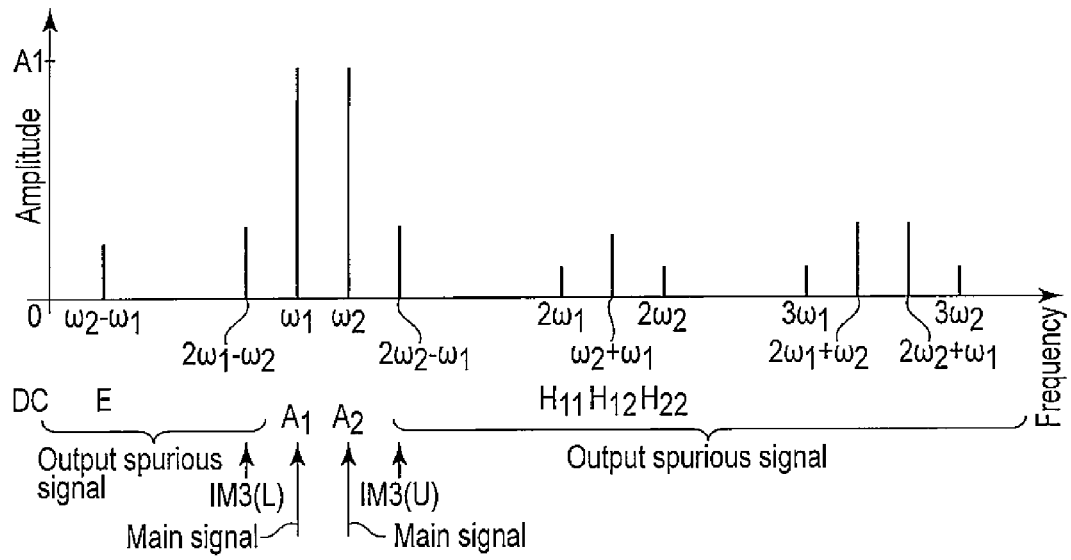
FIG. 6 is a graph showing the frequency characteristics of an RF signal.

FIG. 6 shows components generated based on the above equations. Note that $a_2 x^2$ and $a_3 x^3$ respectively represent distortion components.

Based on equations (1) and (2), a wave $F_L$ of the signal f_large with a large amplitude and a wave $F_H$ of the signal f_small with a small amplitude are given by:

$$\text{f\_large: } F_L = a_1 A_1 + \frac{a_2}{2}(\overline{E}A_2 + H_{11}\overline{A}_1 + 2DCA_1 + H_{12}\overline{A}_2) + \quad \text{equation (3)}$$
$$\frac{a_3}{4}(6A_1 A_2 \overline{A}_2 + 3A_1 A_1 \overline{A}_1)$$

$$\text{f\_small: } F_H = a_2 A_2 + \frac{a_2}{2}(EA_1 + H_{22}\overline{A}_2 + 2DCA_2 + H_{12}\overline{A}_1) + \quad \text{equation (4)}$$
$$\frac{a_3}{4}(6A_1 \overline{A}_1 A_2 + 3A_2 A_2 \overline{A}_2)$$

Factoring equations (3) and (4) yields:

$$\text{f\_large: } F_L = a_1 A_1 + \frac{a_2}{2}(H_{11}\overline{A}_1 + 2DCA_1) + \quad \text{equation (3-1)}$$
$$\frac{a_3}{4}(3A_1 A_1 \overline{A}_1) + \frac{a_2}{2}(\overline{E}A_2 + H_{12}\overline{A}_2) + \frac{a_3}{4}(6A_1 A_2 \overline{A}_2)$$

$$\text{f\_small: } F_H = a_2 A_2 + \frac{a_2}{2}(H_{22}\overline{A}_2 + 2DCA_2) + \quad \text{equation (4-1)}$$
$$\frac{a_3}{4}(3A_2 A_2 \overline{A}_2) + \frac{a_2}{2}(H_{12}\overline{A}_1 + EA_1) + \frac{a_3}{4}(6A_2 \overline{A}_1 A_1)$$

For the wave $F_H$ of f_small, there is a term of second-order distortion in which a signal component of f_small includes an amplitude component $A_1$ of f_large. The term of the second-order distortion is:

$$\frac{a_2}{2}(H_{12}\overline{A}_1 + EA_1)$$

At this time, since the difference between the signal levels of the waves of f_large and f_small is large, that is, $A_2 \ll A_1$, suppression of the wave of f_small with a low signal level becomes large due to the amplitude component of the wave of f_large with a high signal level. It is apparent from the above equations that it is possible to decrease the suppression ratio by controlling the components of $a_2$ (non-linear) and E (an envelope).

A cause-and-effect relationship between ΔP and the f characteristics of the bias circuit for the envelope (E) will be shown. The wave $F_L$ of the signal f_large with a large amplitude and the wave $F_H$ of the signal f_small with a small amplitude are represented by equations (3-1) and (4-1), respectively. Factoring these equations into the terms of a fundamental wave $a_1 x$, second-order distortion $a_2 x/2$, and third-order distortion $a_3 x/4$ gives:

$$a_1 x$$
$$\frac{a_2}{2} x$$
$$\frac{a_3}{4} x$$

equation (3-2)

f_large:
$$F_L \quad A_1 \quad \overline{E}A_2 + H_{11}\overline{A}_1 + 2DCA_1 + H_{12}\overline{A}_2 \quad 6A_1 A_2 \overline{A}_2 + 3A_1 A_1 \overline{A}_1$$

equation (4-2)

f_small:
$$F_H \quad A_2 \quad EA_1 + H_{22}\overline{A}_2 + 2DCA_2 + H_{12}\overline{A}_1 \quad 6A_1 \overline{A}_1 A_2 + 3A_2 A_2 \overline{A}_2$$

Expressions (3-2) and (4-2) represent outputs obtained by substituting, into equation (2), the input signal x represented by:

equation (1-1)

$$x \begin{cases} A_1 e^{jwt} + \overline{A}_1 e^{-jwt} + A_2 e^{jwt} + A_2 e^{-jwt} \\ DC + Ee^{j(-\omega_1+\omega_2)t} + \overline{E}e^{-j(-\omega_1+\omega_2)t} + H_{11}e^{j2w_1 t} + \overline{H_{11}}e^{-j2w_1 t} + H_{22}e^{j2w_2 t} + \overline{H_{22}}e^{-j2w_2 t} + H_{12}e^{j(\omega_1+\omega_2)t} + \overline{H_{12}}e^{-j(\omega_1+\omega_2)t} \end{cases}$$

Considering only the fundamental wave and E, f_large: $F_L = a_1 A_1 + \frac{a_2}{2}\overline{E}A_2$     equation (3-3)

f_small: $F_H = a_1 A_2 + \frac{a_2}{2}EA_1$     equation (4-3)

Assuming that the wave $F_H$ of f_small is on the small signal side, and E has only a complex number, equation (5)

$$\text{if} \begin{cases} \underline{A1 = 1,} \\ \text{Amplitude of wave of f\_large} \\ \underline{a1 = 1,} \\ \text{Fundamental wave} \\ \underline{a2 = 0.1,} \\ \text{Second-order distortion} \\ \underline{E = 0.1,} \\ \text{Envelope} \\ \underline{A2 = 0.1(\text{amount of suppression 40 dB}) \text{to } 1(0 \text{ dB})} \\ \text{Amplitude of wave of f\_small} \end{cases}$$

Increasing the level of the wave $F_H$ of f_small to that of the wave $F_L$ of f_large using the above equation yields:

$$a_1 A_2 \gg \frac{a_2}{2} EA_1$$     equation (6)

Figure 7:
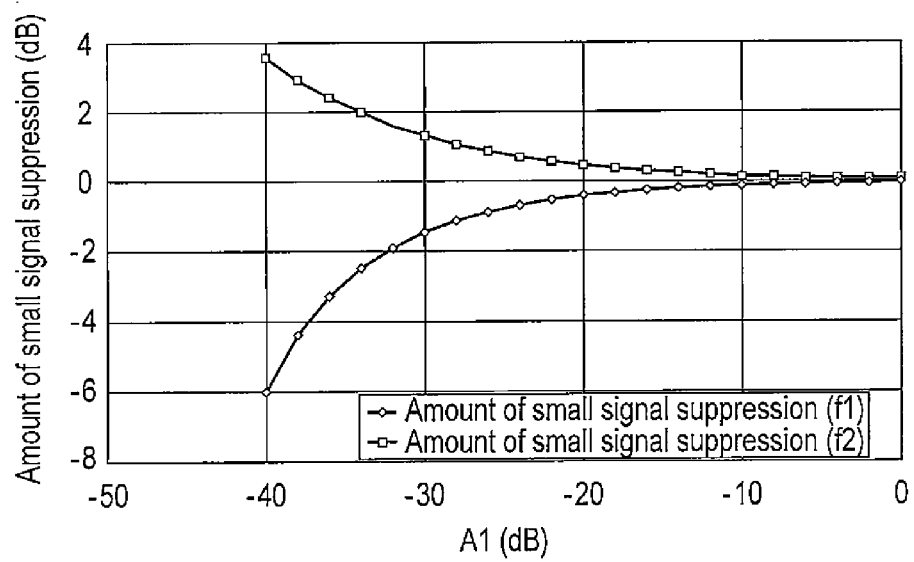
FIG. 7 is a graph for explaining the principle according to which small signal suppression occurs.

According to the above inequality, ΔP becomes almost zero. That is, it is found that if ΔP does not occur when there is no level difference between the wave $F_L$ of f_large and the wave $F_H$ of f_small, and small signal suppression ΔP occurs when there is a level difference between the wave $F_L$ of f_large and the wave $F_H$ of f_small, this is caused by the envelope (E), and the small signal suppression is reduced by improving the frequency characteristics of the bias circuit and decreasing the amount of envelope. FIG. 7 is a graph showing the amount of small signal suppression under the condition of equation (5).

Figure 8:
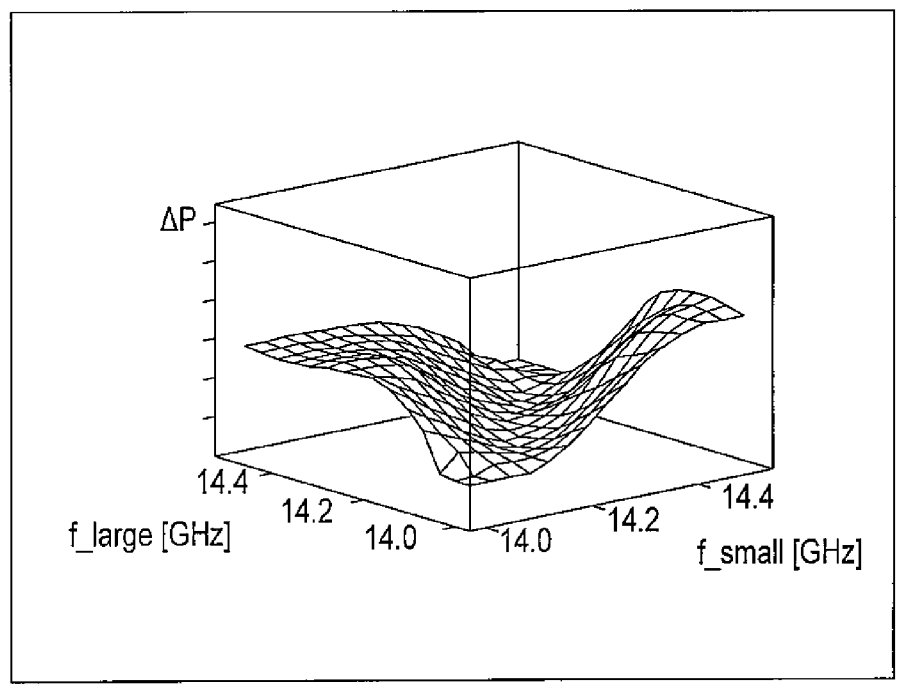
FIG. 8 is a three-dimensional plot showing small signal suppression ΔP of a GaN HEMT.

FIG. 8 is a three-axis plot showing small signal suppression ΔP when f_large and f_small are obtained within the range of up to 500 MHz from 14.0 GHz to 14.5 GHz at an interval of 100 MHz using the GaN HEMT. A horizontal axis shows f_large and f_small, and a vertical axis shows the small signal suppression ΔP. As shown in FIG. 10 (to be described later), since the impedance of the drain bias circuit is not low enough in the envelope frequency domain, a large amount of small signal suppression occurs.

The amount of small signal suppression changes depending on the frequency positions of f_large and f_small, and their frequency relationship is asymmetrical. Since this result depends on the impedance of the non-linear drain bias circuit in the envelope frequency domain, the result of the three-axis plot and its tendency change depending on the impedance of the circuit but an amount of suppression larger than that of small signal suppression due to only the AM-AM characteristics is observed.

As described above, the device parameters of the transistor depend on Vds. As shown in FIG. 5, by making the impedance Z of the drain circuit close to zero, the envelope is decreased and a variation in Vds is reduced. This suppresses the differential modulation Vds(t) of the drain bias and reduces the memory effect, thereby reducing the occurrence of small signal suppression ΔP.

Figure 9:
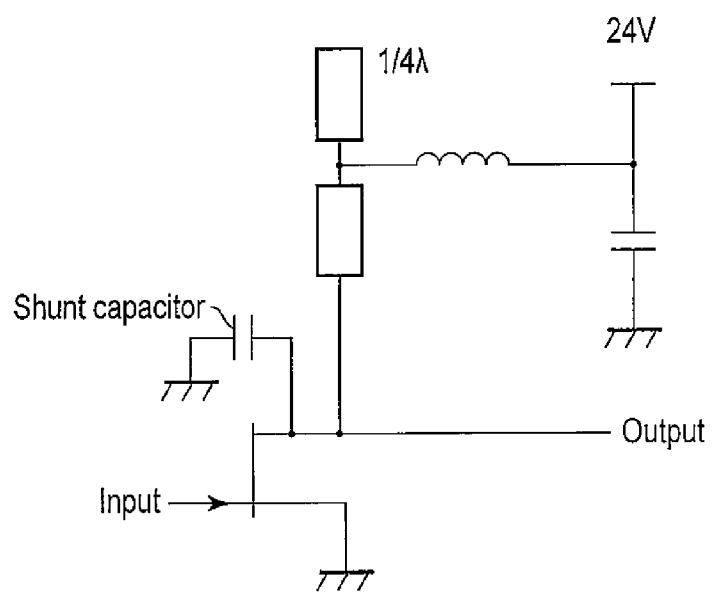
FIG. 9 is an equivalent circuit diagram showing the FET when a shunt capacitor is mounted.

The factor of the envelope (E) is extracted from the above equations by considering the components of the second-order distortion. A shunt capacitor for suppressing the envelope component (E) of the difference frequency between f_large and f_small, therefore, is arranged on the drain output side of the GaN HEMT element, as shown in FIG. 9. This has the effects of decreasing the impedance of the bias circuit in the envelope frequency domain and improving the frequency characteristics of the bias circuit by eliminating the line length on the drain output side of the GaN HEMT element and decreasing the inductance. FIG. 10 shows the impedance of the bias circuit in the envelope frequency domain.

Figure 11A:
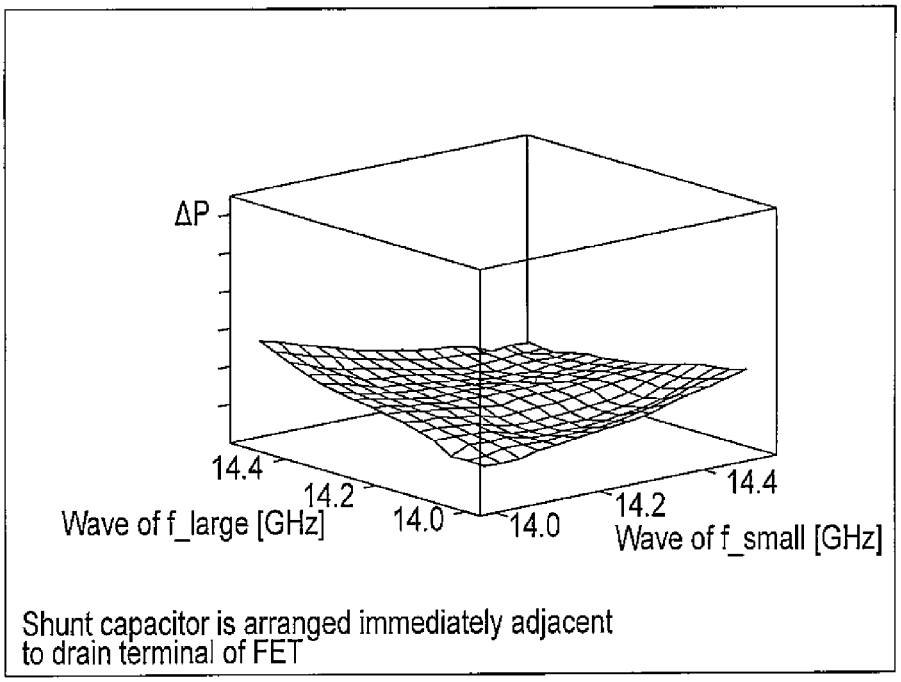
FIGS. 11A and 11B are plots showing a case in which an inductance component due to a bias line length is suppressed to reduce small signal suppression.
Figure 11B:
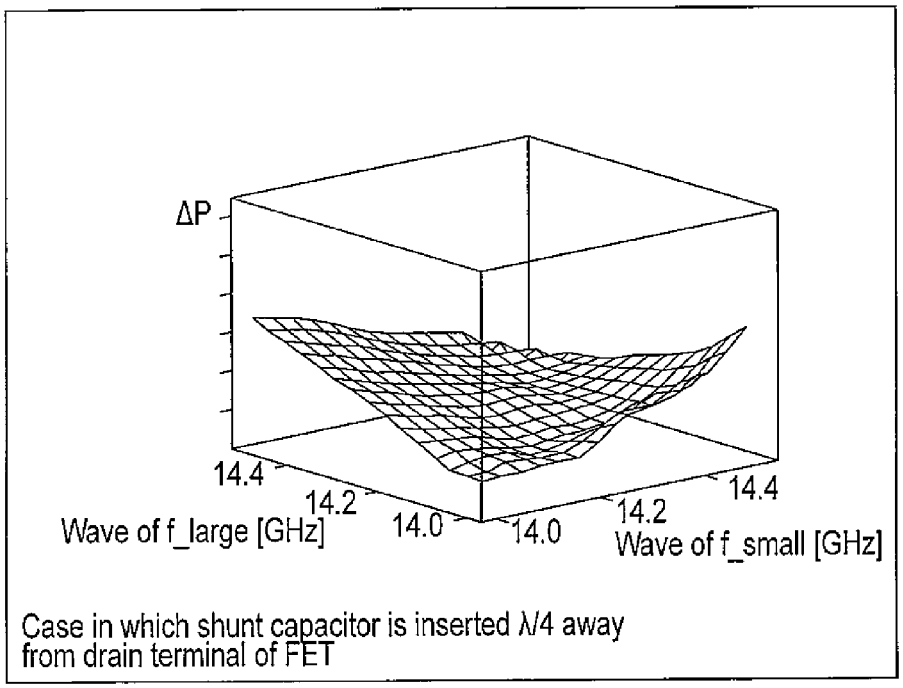

The shunt capacitor is connected to the drain terminal of the FET, and shunts immediately after the drain terminal of the FET, thereby suppressing the inductance component due to the bias line length to reduce small signal suppression, as shown in FIG. 11A. Furthermore, if the shunt capacitor is connected to a point a λ/4 wavelength away from the drain terminal of the FET, small signal suppression is further reduced, as shown in FIG. 11B. As shown in FIG. 11A and FIG. 11B, a horizontal axis shows f_large and f_small, and a vertical axis shows the small signal suppression ΔP. If the shunt capacitor is connected with a drain terminal on a wafer within the package of the internally matched FET, and shunts a signal, the inductance component is further suppressed and small signal suppression is reduced, as shown in FIG. 12. As shown in FIG. 12, a horizontal axis shows f_large and f_small, and a vertical axis shows the small signal suppression ΔP.

Based on the above principle, the embodiment will be described below.

First Embodiment

FIG. 13 is an equivalent circuit diagram showing a power amplification apparatus according to the first embodiment. Assume that the apparatus is arranged in the transmission/reception unit 14 shown in FIG. 1 described above.

An RF signal input to a package 100A of an internally matched FET is supplied to an input terminal 101, and is power-amplified by an FET 103 via an LC circuit 102. An output signal from the drain-wafer terminal of the FET 103 is supplied to a decoupling element 104 including a resistance, coil, and capacitor, which reduces the inductance component of the output signal. The output signal of the decoupling element 104 is extracted from an output terminal 106 through an LC circuit 105, and is supplied to an RF circuit of the succeeding stage.

Reference numeral 200 in FIG. 13 denotes a power supply circuit, which supplies a drain driving power to the FET 103 within the package 100A. A decoupling element 300 including a resistance, coil, and capacitor is connected between the power supply circuit 200 and the package 100A to be parallel to the decoupling element 104.

The decoupling element 300 serves as a lowpass filter which cuts an RF component from the output terminal 106 for the power supply circuit 200.

In the first embodiment, a decoupling element 400 including a resistance, coil, and capacitor is connected at a position within a λ/4 wavelength of the RF signal from the drain-wafer terminal of the FET 103 to be parallel to the decoupling elements 104 and 300. The decoupling element 400 decreases the impedance of the drain bias circuit over a wide band while suppressing anti-resonance with the decoupling elements 104 and 300. The capacitance value of the decoupling element 400 is that between the decoupling elements 104 and 300. An element with a largest capacitance value is the decoupling element 300.

The RF signal output from the package 100A is not shunted, while the envelope component of the difference frequency between f_large and f_small of the RF signal is shunted. This has the effects of decreasing the impedance of the bias circuit in the envelope frequency domain, and improving the frequency characteristics of the bias circuit, without influencing the RF signal.

As described above, in the first embodiment, in a state in which the decoupling element 104 suppresses, as much as possible, the inductance component due to the bias line length immediately after the drain-wafer terminal of the FET 103, the decoupling element 400 is connected in parallel between the decoupling elements 104 and 300 and shunts a signal, thereby sufficiently shorting out the envelope frequency domain of the drain bias circuit.

By, therefore, connecting the decoupling elements 104, 300, and 400 in parallel, and decreasing the impedance of the drain bias circuit over a wide band while suppressing anti-resonance, it is possible to suppress differential modulation of the drain bias to reduce the memory effect, and to reduce the occurrence of suppression of the signal f_small with transmission of the signal f_large.

Second Embodiment

Figure 14:
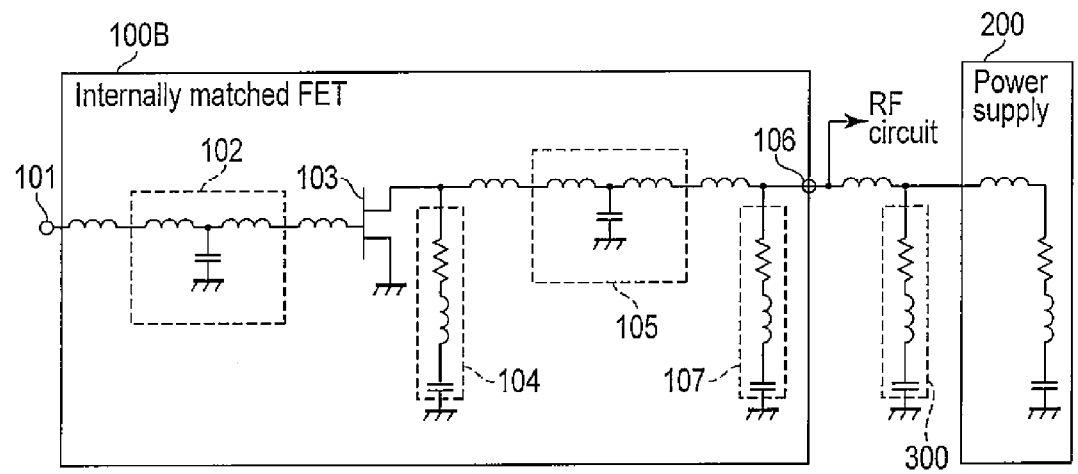
FIG. 14 is an equivalent circuit diagram showing a power amplification apparatus according to the second embodiment.

FIG. 14 is an equivalent circuit diagram showing a power amplification apparatus according to the second embodiment. In FIG. 14, the same parts as those in FIG. 13 have the same reference numerals, and a detailed description thereof will be omitted.

In the second embodiment, a decoupling element 107 is connected in parallel between decoupling elements 104 and 300, and is arranged within a package 100B.

According to the above second embodiment, it is possible to further suppress the inductance component due to the bias line length to reduce small signal suppression, as compared with the first embodiment, while obtaining the same operation and effect as those in the first embodiment.

Third Embodiment

Figure 15:
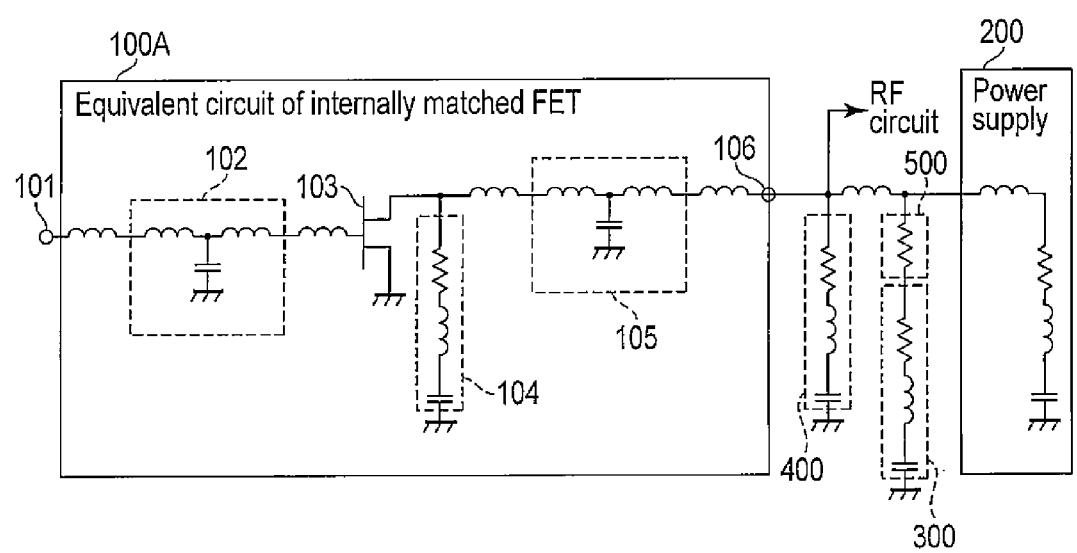
FIG. 15 is an equivalent circuit diagram showing a power amplification apparatus according to the third embodiment.

FIG. 15 is an equivalent circuit diagram showing a power amplification apparatus according to the third embodiment. In FIG. 15, the same parts as those in FIG. 13 have the same reference numerals, and a detailed description thereof will be omitted.

In the third embodiment, a damping resistance element 500 is inserted and connected between a decoupling element 300 and a power supply circuit 200 or package 100A.

According to the above third embodiment, the decoupling element 300 is arranged via the damping resistance element 500, thereby obtaining the decoupling characteristics of the drain bias circuit with a low impedance of up to, for example, 500 MHz.

Fourth Embodiment

FIG. 16 is an equivalent circuit diagram showing a power amplification apparatus according to the fourth embodiment. In FIG. 16, the same parts as those in FIG. 14 have the same reference numerals, and a detailed description thereof will be omitted.

In the fourth embodiment, a damping resistance element 500 is inserted and connected between a decoupling element 300 and a power supply circuit 200 or package 100B, similarly to the above third embodiment.

Also in the fourth embodiment, it is possible to obtain the same operation and effect as those in the second or third embodiment.

Fifth Embodiment

FIG. 17 is an equivalent circuit diagram showing a power amplification apparatus according to the fifth embodiment. In FIG. 17, the same parts as those in FIG. 13 have the same reference numerals, and a detailed description thereof will be omitted.

In the fifth embodiment, a decoupling element 300 is grounded through a damping resistance element 600.

Also in the fifth embodiment, it is possible to obtain the decoupling characteristics of the drain bias circuit with a low impedance of up to, for example, 500 MHz similarly to the third embodiment by grounding the decoupling element 300 through the damping resistance element 600.

Sixth Embodiment

FIG. 18 is an equivalent circuit diagram showing a power amplification apparatus according to the sixth embodiment. In FIG. 18, the same parts as those in FIG. 14 have the same reference numerals, and a detailed description thereof will be omitted.

In the sixth embodiment, a decoupling element 300 is grounded through a damping resistance element 600, similarly to the above fifth embodiment.

Also in the sixth embodiment, it is possible to obtain the same operation and effect as those in the second or fifth embodiment.

Other Embodiments

In the above embodiments, a case in which an input signal is power-amplified to an RF signal including f_large and f_small which have a predetermined frequency difference and level difference has been described. A multilevel modulation input signal with a predetermined bandwidth and level difference may be power-amplified to an RF signal.

In the terrestrial digital television broadcasting, the band is divided into 13 segments, transmission is available in up to three layers, and it is possible to set a multilevel modulation scheme such as 16 QAM (Quadrature Amplitude Modulation), 64 QAM, or 256 QAM for each layer.

FIG. 19 is a schematic view showing the arrangement of a broadcasting station for the above terrestrial digital television broadcasting as an example. Reference numeral 2 denotes a broadcasting station. In the broadcasting station 2, a re-multiplexing apparatus 21 inputs MPEG2 TS packets, and determines, according to a multiple frame pattern determined based on the transmission parameters of a broadcasting wave, a layer to which each packet belongs while generating a TS in which the TS packets (R1, R2, and R3) for the three layers are multiplexed. The TS is converted into a signal for a transmission bandwidth of 500 MHz by performing multilevel modulation such as 64 QAM by a modulation apparatus 22, frequency-converted to the RF band by a transmission unit 23, and power-amplified in a package 100A of an internally matched FET, thereby causing an antenna 24 to transmit the thus obtained signal.

A method of generating the above 64 QAM modulated signal will be described in more detail.

Figure 20:
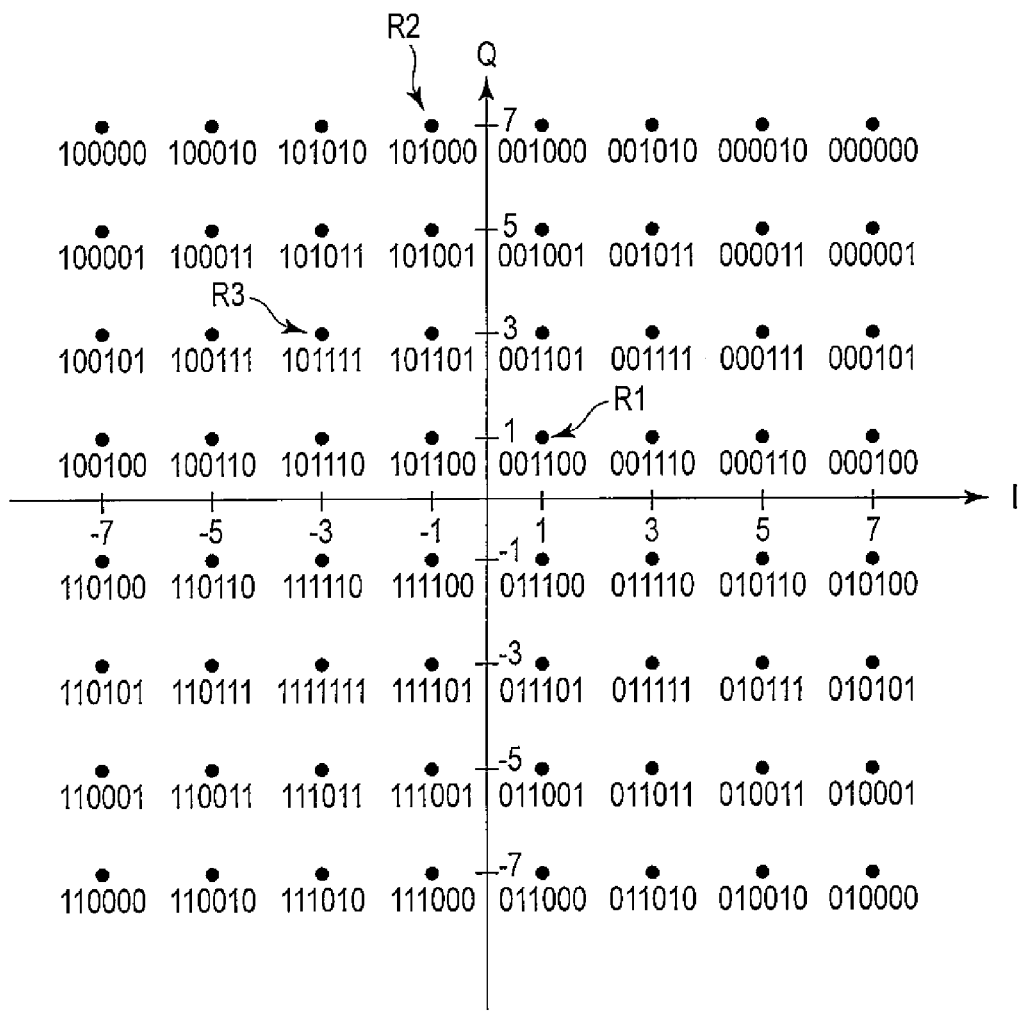
FIG. 20 is a spatial diagram showing 64 QAM modulation.

The respective input data R1, R2, or R3 to the modulation apparatus 22 are grouped by 6 bits like (0, 0, 0, 0, 0, 0) ... (1, 1, 1, 1, 1, 1) (64 combinations), as shown in FIG. 20. Assume that a start point is arbitrary.

If each of the 64 combinations is assigned to each combination (I, Q), (000000)→(I, Q)=(7, 7) ... (111111)→(I, Q)=(−3, −3).

When the input data R1 undergoes modulation by (001100), the I-axis signal component becomes 1 and the Q-axis signal component becomes 1. When the input data R2 undergoes modulation by (101000), the I-axis signal component becomes −1 and the Q-axis signal component becomes 7. Furthermore, when the input data R3 undergoes modulation by (101111), the I-axis signal component becomes −3 and the Q-axis signal component becomes 3.

Figure 21:
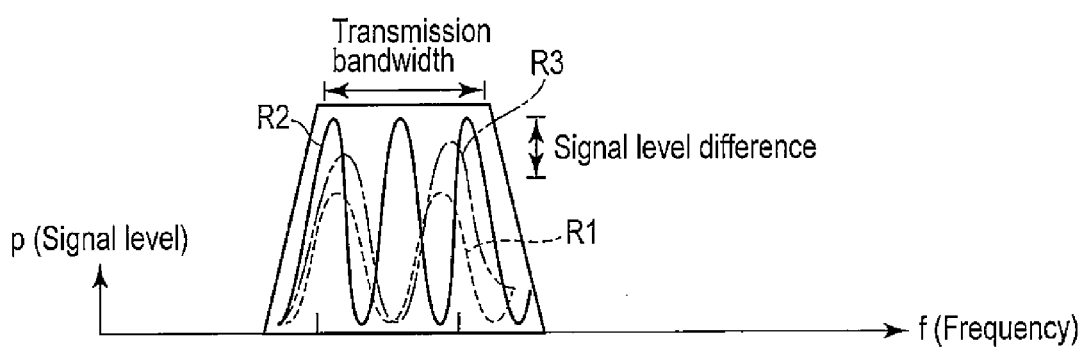
FIG. 21 is a graph showing the frequency characteristics of a signal after 64 QAM modulation according to the other embodiment.

The signal after modulation by the modulation apparatus 22 includes the signals (R1, R2 and R3) for the three layers within the transmission bandwidth, as shown in FIG. 21.

In the terrestrial digital television broadcasting, suppression of a small signal (R1) may occur with a variation in a large signal (R2).

To prevent this, in another embodiment, an RF signal obtained by frequency-converting the modulation output of the modulation apparatus 22 to the RF band is input to the package 100A of the internally matched FET of the above first embodiment.

In this case, the RF signal output from the package 100A is not shunted by the decoupling element 300 but the envelope component of a difference frequency between an R1 signal component and R2 signal component of the RF signal is shunted. This, therefore, has the effects of decreasing the impedance of the bias circuit in the envelope frequency domain and improving the frequency characteristics of the bias circuit, without influencing the RF signal.

In still another embodiment, an RF signal obtained by frequency-converting the modulation output of the modulation apparatus 22 to the RF band may be input to a package 100B of the internally matched FET of the above second embodiment.

In this case, the RF signal output from the package 100B is not shunted by the decoupling element 300 and the decoupling element 107 within the package 100B but the envelope component of a difference frequency between an R1 signal component and R2 signal component of the RF signal is shunted. It is, therefore, possible to further suppress the inductance component due to the bias line length by the decoupling element 107 to reduce suppression of a small signal while having the effect of decreasing the impedance of the bias circuit in the envelope frequency domain, without influencing the RF signal.

In still another embodiment, an RF signal obtained by frequency-converting the modulation output of the modulation apparatus 22 may be input to the package 100A of the internally matched FET of the above third embodiment.

In this case, the RF signal output from the package 100A is not shunted by the decoupling element 300 and the damping resistance element 500 but the envelope component of a difference frequency between an R1 signal component and R2 signal component of the RF signal is shunted. It is, therefore, possible to obtain the decoupling characteristics of the drain bias circuit with a low impedance of up to, for example, 500 MHz.

In still another embodiment, an RF signal obtained by frequency-converting the modulation output of the modulation apparatus 22 to the RF band may be input to the package 100B of the internally matched FET of the above fourth embodiment.

In this case, the RF signal output from the package 100B is not shunted by the decoupling element 300, the damping resistance element 500, and the decoupling element 107 within the package 100B but the envelope component of a difference frequency between an R1 signal component and R2 signal component of the RF signal is shunted. It is, therefore, possible to further suppress the inductance component due to the bias line length by the decoupling element 107 to reduce suppression of a small signal while having the effect of decreasing the impedance of the bias circuit in the envelope frequency domain.

Furthermore, in still another embodiment, an RF signal obtained by frequency-converting the modulation output of the modulation apparatus 22 may be input to the package 100A of the internally matched FET of the above fifth embodiment, or the package 100B of the internally matched FET of the above sixth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplification apparatus comprising:
    a field effect transistor (FET) arranged within a package having an input terminal and an output terminal, and configured to power-amplify an input signal from the input terminal to a transmission signal, for a radio frequency (RF) band, including a first signal and a second signal which include a predetermined frequency difference and level difference, and supply the transmission signal to the output terminal;
    a first decoupling element configured to decrease an inductance component of the transmission signal output from the FET, and output a signal with decreased inductance component;
    a power supply circuit configured to supply a driving power to the FET within the package;
    a second decoupling element configured to cut an RF component from the output terminal for the power supply circuit; and
    a third decoupling element arranged in parallel between the first decoupling element and the second decoupling element, and configured to decrease an impedance of a drain bias circuit over a wide band while suppressing anti-resonance with the first decoupling element and the second decoupling element.

2. The apparatus according to claim 1, wherein capacitance of the second decoupling element is larger than capacitance of the third decoupling element, and the capacitance of the third decoupling element is larger than capacitance of the first decoupling element.

3. The apparatus according to claim 1, wherein
    the first decoupling element is arranged within the package, and
    the second decoupling element and the third decoupling element are arranged outside the package.

4. The apparatus according to claim 1, wherein
    the second decoupling element is arranged outside the package, and
    the third decoupling element is arranged within the package.

5. The apparatus according to claim 1, wherein the third decoupling element is arranged within a wavelength of the transmission signal from the output terminal of the FET.

6. The apparatus according to claim 1, wherein the second decoupling element is connected to the FET or the power supply circuit through a damping resistance element.

7. The apparatus according to claim 1, wherein the second decoupling element is grounded through a damping resistance element.

8. The apparatus according to claim 1, wherein each of the first decoupling element, the second decoupling element, and the third decoupling element includes a plurality of elements.

9. A power amplification apparatus comprising:
    a field effect transistor (FET) arranged within a package having an input terminal and an output terminal, and configured to power-amplify, to a transmission signal for a radio frequency (RF) band, a multilevel modulation input signal which is input to the input terminal and has a predetermined bandwidth and level difference, and supply the transmission signal to the output terminal;
    a first decoupling element configured to decrease an inductance component of the transmission signal output from the FET, and output a signal with decreased inductance component;
    a power supply circuit configured to supply a driving power to the FET within the package;
    a second decoupling element configured to cut an RF component from the output terminal for the power supply circuit; and
    a third decoupling element arranged in parallel between the first decoupling element and the second decoupling element, and configured to decrease an impedance of a drain bias circuit over a wide band while suppressing anti-resonance with the first decoupling element and the second decoupling element.

10. The apparatus according to claim 9, wherein capacitance of the second decoupling element is larger than capacitance of the third decoupling element, and the capacitance of the third decoupling element is larger than capacitance of the first decoupling element.

11. The apparatus according to claim 9, wherein
    the first decoupling element is arranged within the package, and
    the second decoupling element and the third decoupling element are arranged outside the package.

12. The apparatus according to claim 9, wherein
    the second decoupling element is arranged outside the package, and
    the third decoupling element is arranged within the package.

13. The apparatus according to claim 9, wherein the third decoupling element is arranged within a wavelength of the transmission signal from the output terminal of the FET.

14. The apparatus according to claim 9, wherein the second decoupling element is connected to the FET or the power supply circuit through a damping resistance element.

15. The apparatus according to claim 9, wherein the second decoupling element is grounded through a damping resistance element.

16. The apparatus according to claim 9, wherein each of the first decoupling element, the second decoupling element, and the third decoupling element includes a plurality of elements.

* * * * *